United States Patent
Chuang et al.

(10) Patent No.: US 8,858,841 B2
(45) Date of Patent: Oct. 14, 2014

(54) ALUMINUM PASTE COMPOSITION AND SOLAR CELL ELEMENT USING THE SAME

(75) Inventors: Hsun-Jen Chuang, Kaohsiung (TW); Tsai-Fa Hsu, Kaohsiung (TW)

(73) Assignee: Eternal Chemical Co., Ltd., Kaohsiung (TW)

( * ) Notice: Subject to any disclaimer, the term of this patent is extended or adjusted under 35 U.S.C. 154(b) by 127 days.

(21) Appl. No.: 13/181,413

(22) Filed: Jul. 12, 2011

(65) Prior Publication Data
US 2012/0012178 A1 Jan. 19, 2012

(30) Foreign Application Priority Data
Jul. 13, 2010 (TW) ................................ 99123018 A

(51) Int. Cl.
| | | |
|---|---|---|
| *H01B 1/02* | (2006.01) | |
| *H01L 31/0224* | (2006.01) | |
| *H01B 1/22* | (2006.01) | |
| *H01B 1/16* | (2006.01) | |

(52) U.S. Cl.
CPC .......... *H01B 1/22* (2013.01); *H01L 31/022425* (2013.01); *Y02E 10/52* (2013.01); *H01B 1/16* (2013.01)
USPC ...... 252/512; 252/508; 252/514; 106/287.17; 136/256; 136/261; 427/8

(58) Field of Classification Search
CPC ...... H01B 1/16; H01B 1/22; H01L 31/02021; H01L 31/022425
USPC ..................... 252/512, 508, 514; 106/287.17; 136/256, 261; 427/8
See application file for complete search history.

(56) References Cited

U.S. PATENT DOCUMENTS 8,076,570 B2 * 12/2011 Salami et al. ................. 136/256
2002/0176927 A1 * 11/2002 Kodas et al. ...................... 427/8

FOREIGN PATENT DOCUMENTS

CN  101555394 A  10/2009

* cited by examiner

*Primary Examiner* — Khanh Tuan Nguyen
(74) *Attorney, Agent, or Firm* — Shimokaji & Associates, P.C.

(57) ABSTRACT

An aluminum paste composition is provided, which comprises: (a) an aluminum powder, (b) a glass grit, (c) a binder, and (d) a dispersing agent. A solar cell element is further provided, which includes an electrode or wire formed by coating the aluminum paste composition on a silicon semiconductor substrate and drying and sintering it. The dispersing agent contained in the aluminum paste composition of the present invention has good moisture resistance and is capable of effectively addressing the warping problem of a solar cell and improving the adhesion between the backside aluminum paste and the silver paste of the solar cell.

5 Claims, 1 Drawing Sheet

ALUMINUM PASTE COMPOSITION AND SOLAR CELL ELEMENT USING THE SAME

The present application claims the benefit of Taiwan Application No. 099123018 filed Jul. 13, 2010, which is incorporated herein by reference.

BACKGROUND OF THE INVENTION

1. Field of the Invention

The present invention relates to an aluminum paste composition and a solar cell element using the same, and in particular, to an aluminum paste composition for preparing an electrode or a wire on the backside of a silicon semiconductor substrate of a crystal silicon solar cell element, and a solar cell element using the same.

2. Description of the Prior Art

Due to increasingly serious energy shortage and environmental protection problems such as greenhouse effect, many countries have actively developed various alternative energies, among which solar power generation has attracted most attention. FIG. 1 is a schematic cross-sectional structural view of a solar cell element which is fabricated through the following steps. First, a surface of a p-type silicon semiconductor substrate 1 is fabricated into a pyramid-like roughened surface to reduce light reflection (the roughened surface is not shown), and then a reverse conductive n-doped layer 2 is formed onto a light receiving side of the p-type silicon semiconductor substrate 1 by thermally diffusing phosphorous or the like, to form a p-n junction. Then, an anti-reflective layer 3 and an electrode 4 are formed on the n-doped layer 2. A silicon nitride film may be formed on the n-doped layer 2 as the anti-reflective layer 3 by, for example, plasma chemical vapor deposition, and then the front-side electrode 4 is formed by coating a silver conductive adhesive containing silver powder on the anti-reflective layer 3 by screen printing, and then baking, drying and sintering. In the sintering process, the conductive adhesive for forming the front-side electrode 4 may be sintered and penetrate the n-doped layer 2. A backside of the p-type silicon semiconductor substrate 1 is printed with an aluminum conductive adhesive containing an aluminum powder to form an aluminum backside electrode layer 5, and then dried, baked, and sintered at a high temperature. In the sintering process, aluminum atoms diffuse into the p-type silicon semiconductor substrate 1, and an Al—Si alloy layer 6 in alloy state and a p$^+$ layer 7 containing high content of aluminum dopant are formed between the aluminum backside electrode layer 5 and the p-type silicon semiconductor substrate 1. The p$^+$ layer 7 is generally referred to as back surface field (BSF) layer, which can prevent the recombination of electrons and holes, thus facilitating the improvement of the energy transformation efficiency of the solar cell element. Furthermore, in order to serially connect a plurality of solar cell elements to form a module, a silver-aluminum conductive adhesive may be printed onto the aluminum backside electrode layer 5 by screen printing, and then sintered to form a wire 8.

The backside electrode may be formed by printing and drying the silver-aluminum conductive adhesive, and then printing and drying the aluminum conductive adhesive, and baking the two types of conductive adhesives; or by printing and drying the aluminum conductive adhesive, and then printing and drying the silver-aluminum conductive adhesive, and baking the two types of conductive adhesives.

The properties of the aluminum conductive adhesive have great influence on the stability of the solar cell element. If the wettability of the aluminum conductive adhesive to the surface of the substrate is poor, this will result in poor adhesion between the aluminum conductive adhesive and the silicon semiconductor substrate. Moreover, if the difference between the thermal expansion coefficients of the aluminum conductive adhesive and the silicon semiconductor substrate is high, the solar cell element may easily warp. Furthermore, problems such as generation of aluminum beads or bubbles may be caused by different reaction rates of aluminum and aluminum. In the worst case scenario, the above problems may even cause breakage. When the adhesion between the aluminum conductive adhesive and the silver-aluminum conductive adhesive is poor, peeling occurs at the overlap region, which will influence the subsequent process for forming a module by serially connecting a plurality of solar cell elements with the silver-aluminum conductive adhesive if the problem is serious.

Currently known methods for solving the above problems are described in, for example, TW 200713334, TW 200717838, CN 1487531A, CN 1981346A, CN 1877864A, CN 101555388A, and CN 101471389A.

In TW 200713334, an aluminum paste composition is disclosed, which is used to inhibit the generation of bubbles or aluminum particles in an inner electrode layer in sintering, and is characterized by containing an aluminum powder, an organic carrier, and a glass frit. The glass frit accounts for 0.1 to 8 wt % of the aluminum paste composition, and contains 5-75 wt % of an alkali earth metal oxide based on the total weight of the glass frit.

In TW 200717838, a paste composition is disclosed, which is characterized by containing an aluminum powder, an organic carrier, and an adhesion-imparting agent. In this invention, the paste composition containing the adhesion-imparting agent is used to improve the adhesion of an aluminum electrode layer formed on a backside of a silicon semiconductor substrate. The adhesion-imparting agent accounts for 0.05 to 5 wt % of the aluminum paste composition.

In CN 1487531A, an conductive slurry for forming a backside electrode of a silicon solar cell is disclosed, which is used to alleviate warping of silicon chip caused by shrinkage in sintering, and is characterized by containing an aluminum powder, a glass frit, an organic vehicle, and particles slightly soluble or insoluble in the organic vehicle and being at least one of an organic particle or a carbon particle. The glass frit accounts for 1 to 5 wt % of the conductive slurry.

In CN 1981346A, an paste composition is disclosed, which is used to maintain the functions intended to be achieved as a backside electrode of a solar cell element, and enhance the binding of the aluminum electrode layer to the silicon semiconductor substrate, while the content of a glass grit is lowered, or no glass grit is used, and is characterized by containing an aluminum powder, an organic carrier, and a metal alkoxide. The glass grit accounts for 5 wt % or below of the composition.

In CN 1877864A, a slurry composition is disclosed, which has the properties such as good conductivity, high photoelectric conversion efficiency, low warping of silicon chip after sintering, no beads generated, and no bubbles generated, and is characterized by being composed of 70-80 wt % of an aluminum powder, 15-30 wt % of a modified organic binder, and 1-10 wt % of an inorganic binder glass metal powder containing 40-60 wt % of indium, gallium or tantalum.

In CN 101555388A, an inorganic binder for an aluminum slurry is disclosed, which is used to firmly bind an aluminum powder layer onto a silicon chip, and lowers the warping and breakage rate of the cell, and is characterized by being composed of 10-20 wt % of $SiO_2$, 15-30 wt % of $B_2O_3$, 5-15 wt % of $Al_2O_3$, 15-35 wt % of $Bi_2O_3$, 10-18 wt % of $Zr_2O_3$, 10-25 wt % of ZnO, and 1-8 wt % of $MoO_3$.

In CN 101471389A, a backside material for a solar cell element is disclosed, which contains a glass mixture, an organic medium, an aluminum-containing material and an additive, and is used to improve the conversion efficiency of the solar cell element and alleviate the problem of warping. The glass mixture contains, for example, $Al_2O_3$, $Bi_2O_5$, $B_2O_3$, $SiO_2$, PbO, $Ti_2O_3$, and ZnO, and accounts for 5 wt % or below of the total weight of the backside material.

As described above, in the currently known aluminum paste compositions, different components, such as an adhesion-imparting agent, organic compound particles or carbon particles, a metal alkoxide, special metal ions (e.g. indium, gallium, and tantalum), and special metal oxide (e.g. $Zr_2O_3$ and $MoO_3$) are generally added, to inhibit the warping of silicon semiconductor chip, improve the conversion efficiency of the solar cell element, or prevent generation of beads or bubbles in the silicon chip. However, the influence of addition of a dispersing agent on inhibition of the warping of the silicon semiconductor chip, improvement of the conversion efficiency of the solar cell element, or prevention of generation of beads or bubbles in the silicon chip is not disclosed in the prior art. Furthermore, the influence of moisture on the aluminum electrode layer is not disclosed in the prior art, specifically, when the aluminum electrode absorbs the moisture in the air, hydrogen is generated in the packaging process due to the reaction of the moisture and aluminum, which will cause defects after packaging.

SUMMARY OF THE INVENTION

Accordingly, the present invention is directed to an aluminum paste composition having good adhesion properties without being influenced by moisture.

In order to achieve the above and other objectives, the present invention provides an aluminum paste composition comprising (a) an aluminum powder; (b) a glass m; (c) a binder; and (d) a dispersing agent.

The present invention further provides a solar cell element, which includes an electrode or wire formed by printing and sintering the above-mentioned aluminum paste composition on a silicon substrate.

DETAILED DESCRIPTION OF THE INVENTION

Figure 1:
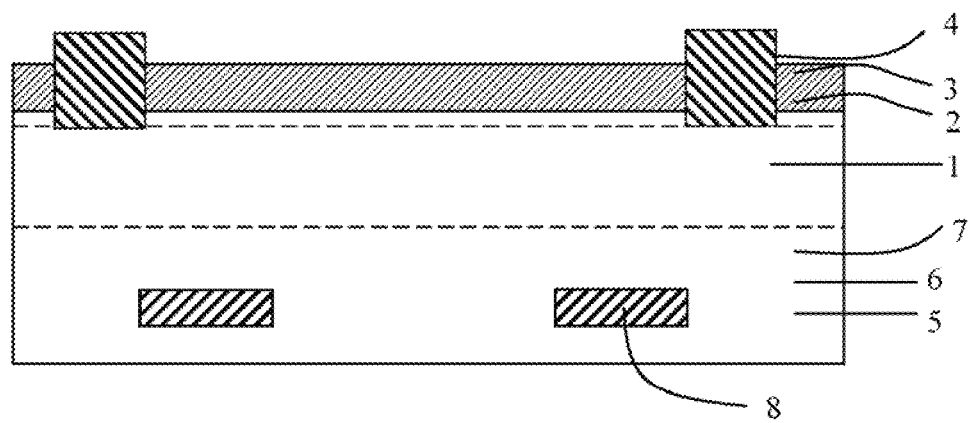
FIG. 1 is a schematic cross-sectional structural view of a solar cell element.

The binder useful in the aluminum paste composition of the present invention is used as a support for the aluminum paste after being dried and before being sintered, and preferably has no carbon residue after being sintered so as to avoid any influence on electrical properties. A resin that may be used as the binder is preferably a thermosetting resin which can be selected from a cellulose, an acrylate resin, an alkyd resin, an epoxy resin, and a mixture thereof, with cellulose, an acrylate resin, and a mixture thereof being preferred.

Celluloses useful in the present invention may include methyl cellulose, ethyl cellulose, wood rosin, polyacrylonitrile (PAN), or a mixture thereof.

According to the present invention, the amount of the binder is about 0.1-30 wt %, and preferably 1.5-5 wt %, based on the total weight of the aluminum paste composition.

A solvent may be optionally added to the aluminum paste composition of the present invention to adjust the viscosity of the aluminum paste composition, where the viscosity is preferably in a range of 10000-40000 cps. In order to avoid the influence on the viscosity of the aluminum paste composition due to quick volatilization of the solvent in printing, thus causing the aluminum paste composition to be unstable in printing, the solvent used preferably has a high boiling point. Commonly used solvents include, for example, but are not limited to, a glycol ether-based organic solvent, such as ethylene glycol monobutyl ether monoacetate, diethylene glycol monobutyl ether, diethylene glycol monobutyl ether (DEG-MBE), a terpene (e.g. terpineol), tetramethyl p-phenylene diamine (TMPD) or a dibasic ester (DBE) mixture. According to the present invention, the amount of solvent is 0-25 wt %, preferably 10-25 wt %, and more preferably 15-20 wt %, based on the total weight of the aluminum paste composition.

The glass grit useful in the aluminum paste composition of the present invention contains an oxide, which can undergo an oxidation-reduction reaction in the sintering process, such that a compact oxide layer is formed on the surface of the aluminum powder, thereby preventing from the reaction between the moisture and aluminum. The aluminum layer of the present invention has low warping property, and has good adhesion with the backside silver overlap region, such that the long-term stability of the solar cell element can be improved and the generation of bubbles or aluminum particles in the aluminum electrode layer funned on the surface of the silicon substrate can be inhibited. The oxide includes, for example, but is not limited to, $B_2O_3$, $Bi_2O_3$, ZnO, $SiO_2$, $Al_2O_3$, $Zr_2O_3$, or a mixture thereof. The amount of the glass grit is properly controlled so as to enhance the adhesion between the electrode/wire and the silicon wafer substrate after sintering, and enhance the caking power between the backside aluminum, the backside silver electrode and the silicon chip. According to the present invention, the amount of the glass grit is about 0.1-15 wt %, preferably 1.0-5.0 wt %, and more preferably 1.5-3.0 wt %, based on the total weight of the aluminum paste composition. Commercially available glass grits useful in the present invention include ASF110. ASF111F, ASF200R, ASF206, ASF700, ASF1780, ASF102Y, ASF1761, ASF0070B, ASF1094, ASF1098, ASF1099, ASF1100, ASF1495, ASF1560, ASF1700, ASF1710, ASF1771, ASF1891, ASF1895, FF201, FF202, FF209, K301, and K303 available from ASAHI GLASS CO., LTD; and BSS01 available from Nihon Yamamura Glass Co., Ltd.

The aluminum powder useful in the aluminum paste composition of the present invention may be an aluminum powder known to persons of ordinary skill in the art, and may be in any suitable form, for example, in the form of metal aluminum, an alloy of aluminum, or a mixture thereof. Commercially available aluminum powder useful in the present invention includes the aluminum powder manufactured by ECKA Company.

According to the present invention, the amount of aluminum powder is 65-85 wt %, and preferably 70-80 wt %, based on the total weight of the aluminum paste composition.

The aluminum paste composition of the present invention contains at least 0.2 wt %, preferably 0.2-3 wt %, and more preferably 0.2-1 wt % of a dispersing agent. The dispersing agent used may facilitate the wetting of the aluminum powder, the glass grit, and an inorganic filler powder, to allow them to be uniformly dispersed in the solvent, so as to avoid aggregation and flocculation phenomena, and improve the long-term storage stability. The aluminum paste composition containing the dispersing agent according to the present invention has a rheological behavior capable of providing high-speed printability to increase the output speed, and achieving densely packed powder particles in the sintering process so as to improve the power generation efficiency. The dispersing agent includes a phosphate ester, linseed oil or octanoic acid or a mixture thereof, with the phosphate ester being preferred. Commercially available dispersing agents useful in the present invention include DISPERBYK-101, DISPERBYK-102, DISPERBYK-103, DISPERBYK-106, DISPERBYK-107, DISPERBYK-108, DISPERBYK-109, DISPERBYK-110, DISPERBYK-111, DISPERBYK-112, DISPERBYK-115, DISPERBYK-116, DISPERBYK-130, DISPERBYK-140, DISPERBYK-142, DISPERBYK-145, DISPERBYK-160, DISPERBYK-161, DISPERBYK-162, DISPERBYK-163, DISPERBYK-164, DISPERBYK-166, DISPERBYK-167, DISPERBYK-168, DISPERBYK-169, DISPERBYK-170, DISPERBYK-171, DISPERBYK-174, DISPERBYK-180, DISPERBYK-192, DISPERBYK-2010, DISPERBYK-2095, and DISPERBYK-2163 available from BYK Company; and TEGO® Dispers 610, TEGO® Dispers 650, TEGO® Dispers 670, TEGO® Dispers 685, TEGO® Dispers 700, TEGO® Dispers 710, TEGO® Dispers 740W, TEGO® Dispers 750W, and TEGO® Dispers 760W available from TEGO Company.

The phosphate ester useful in the aluminum paste composition of the present invention can be represented by Formula (I):

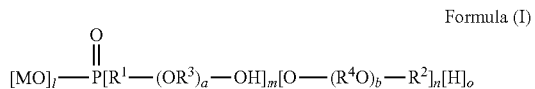

Formula (I)

in which t=0-3, m=0-1, n=0-3, and o=0-3, provided that one of m and n is not 0; M is H, an alkali metal, or a combination thereof; $R^1$, $R^2$, $R^3$ and $R^4$ are each independently a saturated or unsaturated, linear or branched, or cyclic or acyclic alkyl having 1 to 30 carbon atoms: and a=0-20, and b=0-20. According to a preferred embodiment of the present invention, in Formula (I), t=3, m=1, n=0, o=0, M is H, and $R^1$, $R^2$, $R^3$ and $R^4$ are each independently an alkyl having 5 to 22 carbon atoms. The phosphate ester may be a monobasic ester and a salt thereof, a dibasic ester and a salt thereof, a tribasic ester and a salt thereof, or a mixture thereof. The phosphate esters useful in the aluminum paste composition of the present invention include, for example, but are not limited to, isostearyl phosphate, $C_{9-15}$ alkyl phosphate, cetyl phosphate, ceoleth-10 phosphate, PPG-5-ceteth-10 phosphate, oleth-3 phosphate, and DEA-oleth-3 phosphate, with PPG-5-ceteth-10 phosphate or oleth-3 phosphate being preferred.

Commercially available phosphate esters include an alkoxylated alkyl phosphate ester, an alkyl phosphate ester, or a mixture thereof, with alkoxylated alkyl phosphate ester being preferred. Commercially available alkoxylated alkyl phosphate esters useful in the present invention include Crodafos™ C10/5A, Crodafos™ CO10A, Crodafos™ CS2A, Crodafos™ EH5A, Crodafos™ O10A. Crodafos™ O10D, Crodafos™ O3A, and Crodafos™ O3 D available from CRODA Company, and commercially available alkyl phosphate esters include Crodafos™ 810D available from CRODA Company, and Hostaphat CC 100 and Hostaphat CS 120 available from Clariant Company. According to a preferred embodiment of the present invention, Crodafos™ C10/ 5A (PPG-5-Ceteth-10 phosphate) or Crodafos™ O3A (Oleth-3 phosphate) produced by CRODA Company is used.

If desired, the aluminum paste composition of the present invention may contain additives known to persons of ordinary skill in the art, which include, for example, but are not limited to, an inorganic filler, an oxidizing additive, a synergist, a plasticizer, a sensitizer, a coupling agent, a dispersing agent, a wetting agent, a thickening agent, a defomer, and a thixotropic agent.

According to a preferred embodiment of the present invention, the inventive aluminum paste composition contains 70-80% of an aluminum powder, 1.5-3.0 wt % of a glass grit, 0.2-3 wt % of a dispersing agent, and 1.5-5 wt % of a binder, based on the total weight of the aluminum paste composition. Optionally, 15-20 wt % of a solvent is added. The above dispersing agent is selected to be a phosphate ester, the binder is selected to be ethyl cellulose, and the solvent can be DEG-MBE, TMPD, DBE or terpineol or a mixture thereof.

The aluminum paste composition of the present invention may be applied in a solar cell element by any method known to persons of ordinary skill in the art to form an electrode or wire, for example, by a method comprising:

(a) mixing a binder, an aluminum powder, a glass grit, a dispersing agent, and optionally a suitable solvent to form an aluminum paste composition;

(b) coating the aluminum paste composition onto a substrate (e.g. a single crystal silicon wafer) by using a screen printer (the screen used has about 180-400 meshes) to form a desired pattern with a film thickness of about 30-40 μm;

(c) irradiating with an energy ray and/or heating the pattern to cure the pattern; and (d) sintering in a sintering oven to remove the binder and the dispersing agent, and fuse the glass grit and aluminum powder with the substrate to from a wire or an electrode.

The aluminum paste composition of the present invention may be applied in any conventional solar cell element as an electrode or wire in the solar cell element, in replacement of the conventional aluminum paste composition. The aluminum paste composition of the present invention has good adhesion to the semiconductor substrate and silver paste electrode, and will not readily react with the moisture, and thus the falling of the aluminum electrode from the silver wire will not easily occur, and the warping of chip is alleviated, and breakage or troubles in the subsequent process for connecting the solar cell elements via the wire can be avoided, such that the package yield of the solar cell elements can be accordingly enhanced. Furthermore, since the solar cell element prepared according to the present invention will not readily react with the moisture. The long-term stability of the solar cell element in a high-moisture environment can be improved.

In the following examples, the features and applications of the aluminum paste composition of the present invention are further described with reference to an example of the formation of a backside aluminum electrode of a solar cell element; however, the examples are not intended to limit the scope of the present invention. Modifications and variations easily made by persons of ordinary skill in the art are within the disclosure of the specification and the scope of the accompanying claims.

EXAMPLES

TABLE 1

|  | Working Example A | Working Example B | Working Example C | Working Example D | Comparative Example A | Comparative Example B |
|---|---|---|---|---|---|---|
| Binder 1 (Note 1) | 2.060 | 2.347 | 3.967 | 0 | 2.060 | 2.424 |
| Binder 2 (Note 2) | 0 | 0 | 0 | 20.911 | 0 | 0 |
| Solvent (Note 3) | 18.848 | 18.848 | 18.848 | 0 | 18.848 | 18.848 |

TABLE 1-continued

|  | Working Example A | Working Example B | Working Example C | Working Example D | Comparative Example A | Comparative Example B |
|---|---|---|---|---|---|---|
| Additive | 1.798 | 0.802 | 0 | 1.801 | 1.798 | 1.793 |
| Aluminum powder | 74.505 | 74.053 | 74.395 | 74.498 | 74.505 | 74.295 |
| Glass grit (Note 4) | 2.490 | 2.500 | 2.490 | 2.490 | 2.490 | 2.490 |
| Dispersing agent 1 (Note 5) | — | — | — | — | 0.300 | — |
| Dispersing agent 2 (Note 6) | 0.300 | 1.450 | 0.300 | 0.300 | — | 0.150 |
| In total | 100 | 100 | 100 | 100 | 100 | 100 |

Unit: weight percent (%)
(Note 1): Binder 1 is ethyl cellulose (manufactured by Dow Company, and having a trade name of ETHOCEL)
(Note 2): Binder 2 is a mixture of 1,4-butylene glycol diacrylate (manufactured by Sartomer Company) and pentaerythritol triacrylate (manufactured by Sartomer Company)
(Note 3): The solvent is diethylene glycol monobutyl ether and terpineol
(Note 4): The glass grit is a mixture of a glass grit containing $SiO_2$—$B_2O_3$—$Bi_2O_3$ (manufactured by ASAHI GLASS CO., LTD. and having a trade name of ASF1094) and a glass grit containing $B_2O_3$—$Bi_2O_3$—$ZnO$ (manufactured by ASAHI GLASS CO., LTD. and having a trade name of ASF1098)
(Note 5): Dispersing agent 1 is an anionic dispersing agent (manufactured by CRODA Company, and having a trade name of Crodafos ™ KD-15)
(Note 6): Dispersing agent 2 is PPG-5-Ceteth-10 phosphate (manufactured by CRODA Company, and having a trade name of Crodafos ™ C10/5A)

Aluminum pastes were prepared by mixing the components such as the glass grit, the binder, the aluminum powder, and the dispersing agent at the ratios as shown in Table 1 with an optionally added additive or solvent with stirring, and then dispersing.

Test Method 6-inch single crystal silicon wafers having a diffusion-grade roughened surface were prepared, and a commercially available silver-aluminum conductive adhesive was printed on the backsides of the silicon wafers and dried in an IR hot air drying oven at a temperature ranging from 130° C. to 280° C.; and then both the aluminum pastes prepared in a Comparative Example and a Working Example were printed on the backsides, and then dried at a temperature ranging from 130° C. to 280° C. Two commercially available conductive silver pastes were respectively printed onto the front-sides of the two wafers, and then dried in an IR hot air drying oven at a temperature ranging from 130° C. to 280° C., and sintered at a temperature ranging from 700° C. to 900° C. to form solar cell elements for test. In the above steps, the screen of a screen printer used in the printing process is a 200-mesh screen.

Figure 2:
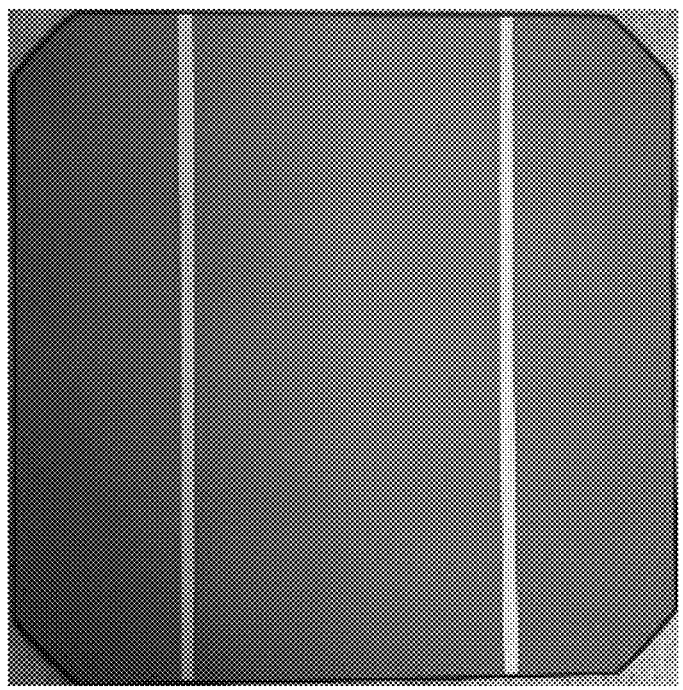
FIG. 2 shows the appearance of the backside of a wafer having a wire fabricated with an aluminum paste according to an embodiment of the present invention.

In the above steps, the sintering step is carried out with an M-225 IR sintering oven manufactured by Thermal Process Solution Company. In the sintering process. The temperature was raised to a desired temperature and maintained at that temperature for a period of time, and then dropped to the room temperature. In the sintering process, the maximal temperature is about 750° C. and a temperature above 600° C. is kept for at least about 5 seconds. After the sintering, edge cutting with laser was performed. FIG. 2 is an appearance of a backside of a wafer having a wire fabricated with an aluminum paste composition of an embodiment of the present invention. The short circuit current (Isc), open-circuit voltage (Voc), power (Pmp), filling factor (F.F.), and photoelectric conversion efficiency (Efficiency) of the wafer of the Working Examples were tested with a WACOM (WXS-220S-L2) photoelectric simulator at AM 1.5G, 1000W/m². The results are recorded in Table 2.

TABLE 2

|  | Isc (A) | Voc (V) | Pmp [W] | F.F. (%) | Efficiency (%) |
|---|---|---|---|---|---|
| Working Example A | 8.270 | 0.6087 | 3.484 | 69.20 | 14.455 |
| Working Example B | 8.316 | 0.6093 | 3.567 | 70.37 | 14.801 |
| Working Example C | 8.300 | 0.6101 | 3.551 | 70.12 | 14.734 |
| Working Example D | 8.303 | 0.6115 | 3.634 | 71.57 | 15.077 |

Water boiling test was performed on the wafers fabricated in the Comparative Examples and the Working Examples. The warping degrees of the wafers prepared in the comparative examples and the working examples were measured, and adhesion force test was performed at the backside aluminum paste of the wafers. The results are recorded in Table 3.

The water boiling test includes placing the wafers fabricated in the Comparative Examples and the Working Examples in water of 80° C. for 5 min, to observe whether bubbles are generated. The warping degree test includes measuring the heights at the highest points of the wafers fabricated in the comparative examples and the working examples with a laser thickness-measuring instrument as the values of warping degrees, and the adhesion force test includes closely attaching 3M tapes onto the overlaps of the backside silver paste with the backside aluminum paste on the wafers fabricated in the comparative examples and the working examples, and then testing with a tensile testing station at a peeling angle of 180 degrees and a rate of 300 mm/min.

TABLE 3

|  | Warping degree (mm) | Adhesion force | Water boiling |
|---|---|---|---|
| Working Example A | 1.67 | ○ | No bubbles |
| Working Example B | 1.50 | ○ | No bubbles |
| Working Example C | 1.45 | ○ | No bubbles |
| Working Example D | 1.68 | ○ | No bubbles |
| Comparative Example A | 1.45 | ○ | Bubbling |
| Comparative Example B | 1.51 | X | Bubbling |

It can be seen from comparing Working Example A with Comparative Example A the influence of the use of different dispersing agents in the aluminum paste compositions on the water boiling resistance, where the use of an anionic dispersing agent (dispersing agent 1) cannot prevent from the reaction of the moisture with the aluminum layer of the solar cell element, and thus bubbling phenomenon occurs.

Furthermore, it can be seen from comparing Working Example A, Working Example B, and Comparative Example B the influence of the amount of the dispersing agent on the water boiling resistance and on the adhesion force between the aluminum paste and silver/aluminum wire. Where when the amount of the dispersing agent is 0.15%, the reaction of the moisture with the aluminum layer of the solar cell element cannot be effectively prevented, and thus bubbling phenomenon occurs; and the adhesion between the aluminum paste and the silver/aluminum wire is poor.

The solar cell element using the aluminum paste according to the present invention can desirably prevent from the reaction of the moisture with the aluminum layer, and improve the adhesion between the aluminum paste and silver/aluminum wire, while eliminating the warping problem of the solar cell element.

We claim:

1. An aluminum paste composition for a solar cell element, comprising: (a) 65-85 wt % of an aluminum powder; (b) 0.1-15 wt % of a glass grit; (c) 0.1-30 wt % of a binder; and (d) 0.2-3 wt % of a dispersing agent, based on the total weight of the composition; wherein the dispersing agent comprises a phosphate ester, linseed oil, octanoic acid, or a mixture thereof.

2. The aluminum paste composition according to claim 1, wherein the dispersing agent is a phosphate ester.

3. The aluminum paste composition according to claim 2, wherein the phosphate ester comprises an alkoxylated alkyl phosphate ester, an alkyl phosphate ester, or a mixture thereof.

4. The aluminum paste composition according to claim 2, wherein the phosphate ester is isostearyl phosphate, $C_{9-15}$ alkyl phosphate, cetyl phosphate, ceoleth-10 phosphate, PPG-5-ceteth-10 phosphate, oleth-3 phosphate, or DEA-oleth-3 phosphate.

5. A solar cell element, comprising an electrode or a wire comprising the aluminum paste composition according to any one of claims 1 to 4 after being dried and sintered.

* * * * *